United States Patent [19]

Ogura

[11] Patent Number: 4,564,854
[45] Date of Patent: Jan. 14, 1986

[54] COMBINED MOS/MEMORY TRANSISTOR STRUCTURE

[75] Inventor: Mitsugi Ogura, Yokohama, Japan

[73] Assignee: Tokyo Shibaura Denki Kabushiki Kaisha, Kawasaki, Japan

[21] Appl. No.: 562,033

[22] Filed: Dec. 15, 1983

Related U.S. Application Data

[63] Continuation of Ser. No. 199,925, Oct. 23, 1980, abandoned.

[30] Foreign Application Priority Data

Oct. 29, 1979 [JP] Japan .................................. 54-138655

[51] Int. Cl.[4] ...................... H01L 29/78; H01L 27/04; G11C 11/40
[52] U.S. Cl. ..................................... 357/23.6; 357/59; 357/71; 357/23.3
[58] Field of Search ............... 357/59, 71, 23 C, 23 S, 357/23.6, 23.3

[56] References Cited

U.S. PATENT DOCUMENTS

| | | | |
|---|---|---|---|
| 4,012,757 | 3/1977 | Koo | 357/71 |
| 4,085,498 | 4/1978 | Rideout | 357/59 |
| 4,099,196 | 7/1978 | Simko | 357/59 |
| 4,162,506 | 7/1979 | Takei | 357/41 |
| 4,178,674 | 12/1979 | Liu et al. | 357/59 |
| 4,239,559 | 12/1980 | Ito | 357/59 |
| 4,249,968 | 2/1981 | Gardiner et al. | 357/59 |
| 4,278,989 | 7/1981 | Baba et al. | 357/59 |
| 4,291,322 | 9/1981 | Clemens et al. | 357/59 |
| 4,297,721 | 10/1981 | McKenny et al. | 357/59 |

Primary Examiner—William D. Larkins
Assistant Examiner—Charles S. Small, Jr.
Attorney, Agent, or Firm—Finnegan, Henderson, Farabow, Garrett & Dunner

[57] ABSTRACT

A semiconductor device embodying this invention comprises a first conductive layer deposited on a semiconductor substrate to form a first element; a second conductive layer constituting a second element; and a third conductive layer superposed on the second conductive layer with an insulation layer interposed between said second and third conductive layers to form a third element. Only the second conductive layer formed from portions of the same layer of a conductive material is oxidized to provide an insulation layer; and consequently the first conductive layer is made thicker than the second conductive layer.

4 Claims, 14 Drawing Figures

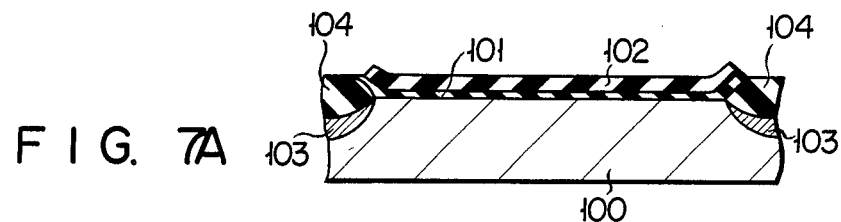
F I G. 7A
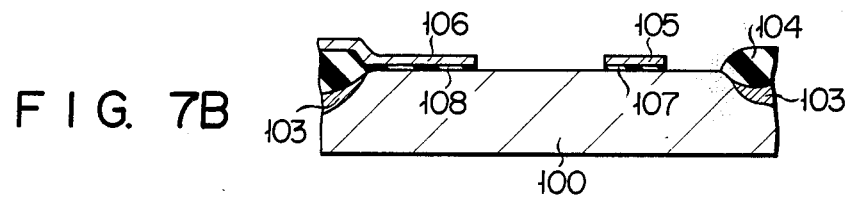
F I G. 7B
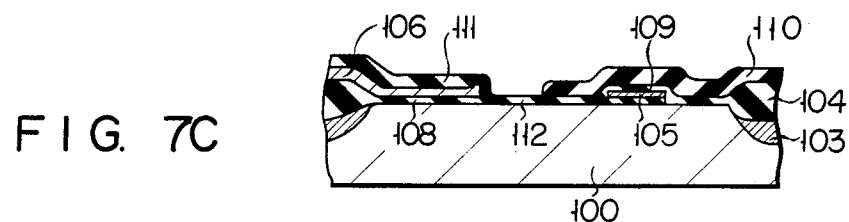
F I G. 7C
F I G. 7D                F I G. 7E
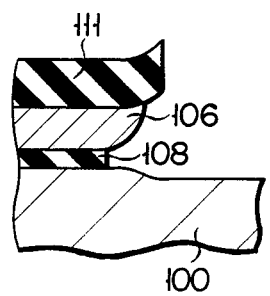    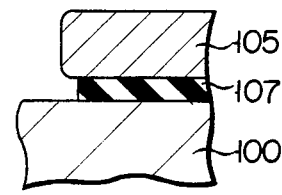
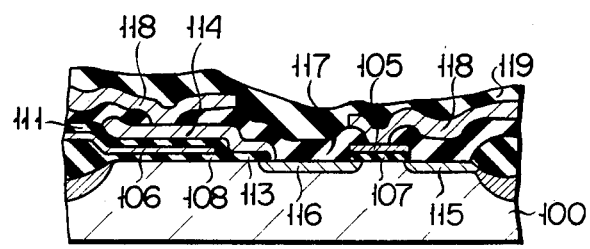
F I G. 7F

COMBINED MOS/MEMORY TRANSISTOR STRUCTURE

This is a continuation of application Ser. No. 199,925, filed Oct. 23, 1980, now abandoned.

BACKGROUND OF THE INVENTION

This invention relates to a semiconductor device and more particularly to a semiconductor device in which conductive layers constituting two different elements spatially overlap each other as in an MOS dynamic random access memory, and a method of manufacturing the same.

In recent years, the integrated circuit technique has achieved a remarkable progress. In particular, the process of effecting high integration, that is, the extreme miniaturization of IC elements has advanced at a surprisingly high speed. Above all, a double-layer polysilicon structure of a semiconductor device has made a prominent contribution to the high integration and extreme miniaturization of IC elements. This double-layer polysilicon technique is characterized by causing part of the polysilicon conductive layer of one of two different adjacent MOS field effect elements formed on the same substrate to be superposed on the polysilicon conductive layer of the other MOS field effect element with an insulation layer interposed therebetween, and the degree of integration is advanced by reducing a space defined between two different elements as much as possible.

The double-layer polysilicon structure has another advantage that a contact between a second polysilicon layer and an overlying aluminum wire is effected at a point above the region of a first polysilicon layer, thereby prominently progressing the degree of integration. Where, however, a pattern is chosen to have as fine a width as 3 to 4 microns in order to prominently elevate the degree of integration, then an inter-layer insulation film has to be formed by wet oxidation, giving rise to a number of problems. Description is now given of the difficulties accompanying the abovementioned double-layer structure process, with reference to the MOS dynamic random access memory (referred to as MOS dynamic RAM) to which said double-layer structure is particularly applied.

With the MOS dynamic RAM of the present day, a plurality of memory cells, in each of which one transistor 1 and one capacitor 2 shown in FIG. 1 jointly constitute one bit are arranged, as shown in FIG. 2, in the directions of the row and column on a semiconductor chip 5, thereby providing memory arrays 6. Those portions of the chip which cause external data to be written in the memory cell, and conversely cause data to be read out of the memory cell and generate memory cell-actuating signals are collectively referred to as a "peripheral circuit 7". The transistor 3 of FIG. 1 is included in the peripheral circuit 7. The gate electrode of the transistor 1 and the electrode of the capacitor 2 both included in each of the abovementioned memory cells 6 are fabricated with the overlapping double-layer polysilicon structure. The gate electrode of the peripheral circuit 7 is formed when the first or second polysilicon layer is produced, thus constituting the ordinary single layer polysilicon structure. Referring to FIG. 1, line W is a word line, and line B is a bit line.

FIG. 3 is a sectional view of a semiconductor device constituted by an IC version of the circuit of FIG. 1.

The transistor 3 of FIG. 1 comprises a source region 11, drain region 12, gate oxide film 13 and gate electrode 14 all formed in or on a semiconductor substrate 10. The capacitor 2 of FIG. 1 is formed of an insulation layer 15 and electrode 16. The transistor 1 of FIG. 1 is constituted by a gate oxide film 17, gate electrode 18, etc. As seen from FIG. 3, the electrode 16 of the capacitor 2 and part of the gate electrode 18 of the transistor 1 spatially overlap each other with an insulation layer 19 interposed therebetween. FIG. 4 is an enlarged view of the section IV of FIG. 3, and FIG. 5 is also an enlarged view of the section V of FIG. 3.

With the above-mentioned conventional semiconductor device-manufacturing method, insulation layers 19, 19' are provided by wet oxidizing first polysilicon conductive layers 14, 16 after said conductive layers have been patterned in order to ensure insulation between first polysilicon conductive layer 16 and a second polysilicon conductive layer 18. However, the conventional wet oxidation process has the drawbacks that while an insulation layer is grown by the oxidation of the substrate 10 and the first polysilicon conductive layers 14, 16, the edges of said conductive layers 14, 16 often tend to be turned up. On the other hand, the impurities used for the formation of the regions 11, 12 of the transistor 3 are likely to be diffused by self alignment technics into the substrate by using the first polysilicon conductive layers 14, 16 as diffusion mask. Since the edges of the first polysilicon conductive layers 14, 16 are turned up, the above-mentioned impurities are ready to spread through the substrate more in the horizontal direction thereof, thereby prominently shortening the effective channel length of the transistor 3. FIG. 6A and FIG. 6B illustrate the defect of the conventional wet oxidation process used in producing a semiconductor device in comparison with the ordinary dry oxidation process applied in manufacturing an insulation gate type semiconductor device. FIG. 6A is a sectional view of an MOS transistor included in the peripheral circuit of a double-layer polysilicon structure type semiconductor device and fabricated by the aforesaid prior art wet oxidation process. FIG. 6B is a sectional view of an MOS transistor produced by the ordinary chemical vapor deposition and dry oxidation process. With the widths $L_1$, $L_2$ of the polysilicon electrodes of FIGS. 6A and 6B taken to be 4 microns and the diffusion depth $X_j$ of FIGS. 6A and 6B assumed to be 0.4 micron, then a difference between the effective channel length $l_2$ of the MOS transistor of FIG. 6B and the effective channel length $l_1$ of the MOS transistor of FIG. 6A is as large as 0.7 micron.

The effective channel length of an MOS transistor set in a large scale integration (LSI) circuit has to be defined with great care in consideration of, for example, an undesirable short channel effect and punch-through withstand voltage. The width of a polysilicon electrode is generally determined by adding the extent to which an impurity is diffused in a substrate in the horizontal direction thereof to the predetermined channel length of the MOS transistor. This means that in the case of the semiconductor device having the double-layer polysilicon structure as shown in FIG. 6A, the width of a polysilicon electrode has to be extended by 0.7 micron as a result of the afore-mentioned turned up condition of the edges of the first polysilicon conductive layer. The extension of the width of a polysilicon electrode leads to an enlarged area of a chip. Further, the enlarged width of a polysilicon electrode results in a corresponding rise in the gate capacity, undesirably retarding the operation of a semiconductor device and increasing its power consumption.

A more important problem is that prominent variations occur in the threshold voltage of the MOS transistor. As previously described, the turned up condition of the edges of the polysilicon electrode causes an impurity to be more noticeably diffused in the horizontal direction of a substrate, allowing variations to take place more readily in the threshold voltage of the MOS transistor due to the objectionable short channel effect. Consequently where, for example, an MOS dynamic RAM is applied, then the sensitivity of a sensing circuit falls under the above-mentioned condition.

Further with the prior art semiconductor device-manufacturing method, a memory cell region in which the first polysilicon conductive layer 16 and second polysilicon conductive layer 18 overlap each other has a greater height than the peripheral circuit region by the thickness of said second polysilicon conductive layer 18. The presence of such stepped portion reduces the precision with which a pattern is resolved through an IC mask, prominently obstructing the fine communication of IC elements.

SUMMARY OF THE INVENTION

It is accordingly an object of this invention to prevent the edges of a polysilicon conductive layer from being turned up.

Another object of the invention is to provide a semiconductor device such as an MOS dynamic RAM which allows for the easy high integration and comminution of semiconductor elements.

To attain the above-mentioned objects, this invention provides a semiconductor device-manufacturing method which comprises applying an oxidation-resistant film on a first conductive layer made of a first conductive material layer; wet oxidizing the second conductive layer made of the first conductive material layer to provide an insulation layer; and spatially superposing a third conductive layer made of a second conductive material layer on the second conductive layer with said insulation layer interposed therebetween. With a semiconductor device manufactured by the above-mentioned method of this invention, the first conductive layer is made thicker than the second conductive layer though both layers are made of the same polysilicon layer.

Figure 6A:
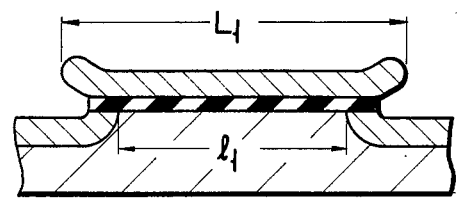
FIG. 6A is a sectional view of a polysilicon layer on which an insulation layer is formed by the prior art wet oxidation process.
Figure 6B:
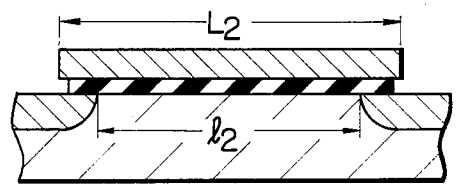
FIG. 6B is a sectional view of a polysilicon layer on which an insulation layer is formed by the ordinary chemical vapor deposition and dry oxidation.

(Both FIGS. 6A and 6B jointly indicate a difference between the effective channel length of an MOS transistor based on the wet oxidation process of FIG. 6A and that of an MOS transistor based on the chemical vapor deposition and dry oxidation process of FIG. 6B.)

Figure 8:
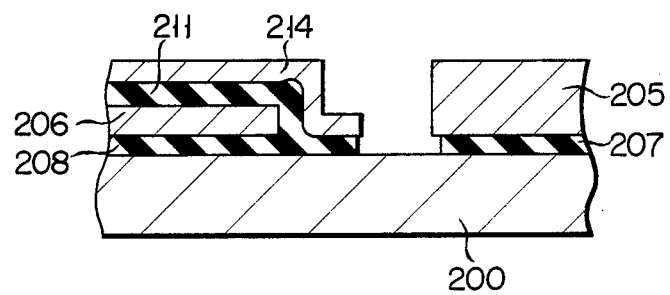

FIGS. 7A to 7F are sectional views illustrating the sequential steps of manufacturing a semiconductor device according to one embodiment of this invention; and FIG. 8 is a sectional view of a semiconductor device according to another embodiment of the invention.

DETAILED DESCRIPTION OF THE PREFERRED EMBODIMENTS

Figure 1:
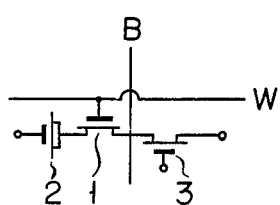
FIG. 1 schematically shows a circuit arrangement of part of a memory cell array included in an MOS dynamic RAM.
Figure 2:
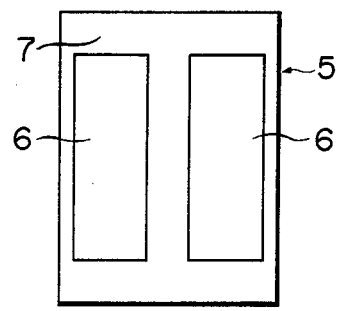
FIG. 2 is a schematic plan view of a chip in which the memory cell arrays shown in FIG. 1 are formed in a plural number.
Figure 3:
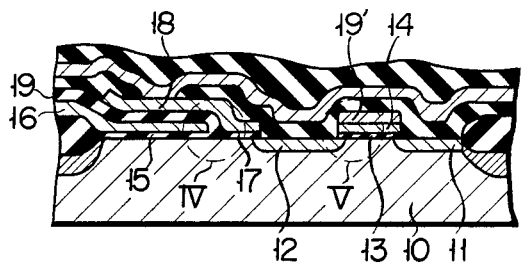
FIG. 3 is a sectional view of the conventional semiconductor device constituting the memory cell array of FIG. 1.
Figure 4:
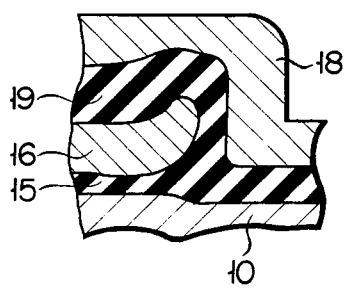
FIG. 4 is an enlarged sectional view of the section IV of FIG. 3.
Figure 5:
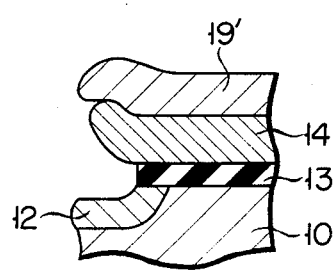
FIG. 5 is an enlarged sectional view of the section V of FIG. 3.

Description is now given with reference to FIGS. 7A to 7F of a semiconductor device according to one embodiment of this invention. FIGS. 7A and 7F indicate the sequential steps of manufacturing one of memory cells (whose circuit arrangement is shown in FIG. 1) included in an MOS dynamic RAM.

Referring to FIG. 7A, the surface of a P type silicon substrate 100 is thermally oxidized to provide a $SiO_2$ layer 101. A silicon nitride layer ($Si_3N_4$) 102 is deposited on the $SiO_2$ layer 101. A photolithography resist, not shown, (hereinafter referred to as "a resist") is coated on the silicon nitride layer 102 and a required resist pattern is formed by photoetching using an IC mask. The $Si_3N_4$ layer 102 is etched, with the patterned resist used as a mask. The underlying $SiO_2$ layer 101 is etched to provide an element region and an inter-element region (field region). The $Si_3N_4$ layer 102 is retained in the element region. The substrate 100 is partly exposed in the field region. Boron is diffused in the exposed portions of the substrate 100 by ion implantation to ensure the isolation of every adjacent elements, thereby providing ion-implanted boron layers 103. Thereafter, the exposed portions of the substrate 100 are oxidized in an atmosphere of dry oxygen kept at a high temperature of about 1,100° C. to form field oxide layers 104 having a thickness of 1 to 1.5 microns (FIG. 7A).

The $Si_3N_4$ layer 102 and $SiO_2$ layer 101 are all removed, and a new oxide layer is formed all over the substrate 100. A first polysilicon layer is deposited on all the oxide layer. A resist is set on the first polysilicon layer, and thereafter patterned. The first polysilicon layer is selectively etched with the patterned resist used as a mask to provide a first conductive layer 105 acting as a gate electrode and a second conductive layer 106 acting as a capacitor electrode. The underlying oxide layer is etched to form a gate oxide layer (first insulation layer) 107 under the first conductive layer 105 and a second insulation layer 108 under the second conductive layer 106 (FIG. 7B).

The first conductive layer 105, second conductive layer 106 and substrate 100 are oxidized to provide a thin $SiO_2$ layer 109. A $Si_3N_4$ layer 110 is deposited all over the $SiO_2$ layer 109. A resist is coated on the $Si_3N_4$ layer 110 and then patterned. The $Si_3N_4$ layer 110 is selectively etched with the patterned resist used as a mask. That portion of the $Si_3N_4$ layer which was formed in a memory cell array region including the second conductive layer 106 is etched off. The first conductive layer 105 of the peripheral circuit region is covered with the remainder of the $Si_3N_4$ layer 110. Wet oxidation is carried out in a steam-containing oxygen atmosphere at a temperature of 800 to 900° C. to form a thick SiO₂ layer 111 of about 5,000 Å on the exposed second conductive layer 106. This wet oxidation process produces a SiO₂ layer 112 also on the exposed portion of the substrate 100. If said oxidation is carried out under proper conditions, then the speed at which the SiO₂ layer 112 is grown on the substrate is retarded. For instance, the SiO₂ layer 111 is formed on the polysilicon layer to a thickness of 5,000 Å, whereas the deposition of the SiO₂ layer 112 on the silicon substrate is restricted to a thickness of about 2,000 Å (FIG. 7C).

The Si₃N₄ layer 110 is etched off, and thereafter the SiO₂ layers 109, 111, 112 deposited all over the substrate 100 are etched. In this case, it well serves the purpose if the thin SiO₂ layer 112 deposited on the substrate 100 is completely etched off. With the foregoing embodiment, the etching of said SiO₂ layers is carried out to an extent of about 2,500 Å. As a result, the thick SiO₂ layer 111 is retained as a third insulation layer, though partly etched. FIG. 7D is an enlarged sectional view of part of a memory cell array region and FIG. 7E is that of part of a peripheral circuit region when the above-mentioned steps are brought to an end. The second conductive layer 106 acting as a capacitor electrode is made thinner, than the first polysilicon layer initially formed in the step of FIG. 7B. This decrease in the thickness of the second conductive layer 106 results from the wet oxidation of the first polysilicon layer to provide the SiO₂ layer 111. Where a SiO₂ layer having a thickness of about 5,000 Å is formed from a polysilicon layer, for example, by wet oxidation, then said polysilicon layer is decreased in thickness by about 3,000 Å. A SiO₂ layer formed by wet oxidation is retained on the second conductive layer 106 to constitute a third insulation layer 111. As apparent from FIG. 7E, the first conductive layer 105 acting as a gate electrode is prevented from being turned up by wet oxidation and is rendered flat. Consequently the thickness of said first conductive layer 105 is retained at exactly the same level as that of the initially formed first polysilicon layer.

A SiO₂ layer to be altered a gate oxide layer 113 is formed to produce a transistor included in a memory cell. A second polysilicon layer is deposited all over the substrate. A resist is coated on said second polysilicon layer and patterned. The second polysilicon layer is selectively etched with the patterned resist used as a mask, thereby providing a third conductive layer 114 acting as a gate electrode. The gate oxide layer 113 is formed and the substrate 100 is partly exposed by etching the SiO₂ layer. An impurity such as phosphorus or arsenic is diffused in the substrate 100 with the first conductive layer 105, second conductive layer 106 and third conductive layer 114 used as masks to provide, for example, a source region 115 and drain region 116. A SiO₂ layer or phosphosilicate glass layer is deposited by chemical vapor deposition all over the substrate to form an insulation layer 117. After a contact hole is formed, an aluminum wire 118 is provided by the ordinary process. Last, an insulation layer 119 such as a phosphosilicate glass layer is applied all over the semiconductor device thus fabricated for its protection (FIG. 7F).

The present invention enables a third conductive layer 214 acting as the gate electrode of an MOS transistor included in a memory cell array region and a first conductive layer 205 acting as the gate electrode of an MOS transistor included in the peripheral circuit region to have substantially the same height. Now let it be assumed that a first polysilicon layer is formed to a thickness of, for example, 7,000 Å; said first polysilicon layer is wet oxidized in the memory cell array region to provide a SiO₂ layer having a thickness of 5,500 Å; said SiO₂ layer is etched off by 4,000 Å to provide a third conductive layer. Then, the thickness of a second conductive layer 206 deposited on the second insulation layer 208 included in the memory cell array region has its thickness decreased to 3,500 Å by the above-mentioned wet oxidation. As a result, a third insulation layer 211 deposited on said second conductive layer 206 has a thickness of 1,500 Å. If a third conductive layer 214 is formed on said third insulation layer 211 to a thickness of 2,000 Å, then a height from the second insulation layer 208 in the memory cell array region to the surface of the third conductive layer 214 measures 7,000 Å. The thickness of the first polysilicon layer remains exactly the same as that of the first conductive layer 205, then a height from the first insulation layer 207 to the surface of the first conductive layer 205 measures 7,000 Å. Even if the above-mentioned special conditions are not chosen, the method of this invention obviously more reduces a difference between the height of the peripheral circuit region and that of the memory cell array region than in the conventional method in which wet oxidation is carried out all over the peripheral circuit region and memory cell array region.

According to the method of this invention, the sheet resistance of the capacitor electrode (second conductive layer) of the memory cell array region can be rendered higher than the sheet resistance of the gate electrode (first conductive layer) of the peripheral circuit region, though both electrodes are formed from the same first polysilicon layer. The first polysilicon layer is commonly doped with a large amount of an impurity, for example, at a concentration of $1 \times 10^{20} \text{cm}^{-3}$ in order to have its sheet resistance reduced. Where said first polysilicon layer is oxidized, then an impurity diffused therein tends to be segregated toward the resultant SiO₂ layer, causing the polysilicon layer to have a high sheet resistance. Further, oxidation reduces the thickness of said first polysilicon layer, thereby increasing its sheet resistance. According to the method of this invention, the peripheral circuit region is covered with an oxidation-resistant Si₃N₄ layer, preventing the first polysilicon layer from decreasing in an amount of a doped impurity and also in its thickness, and consequently making it possible to provide a gate electrode having a low sheet resistance.

With the foregoing embodiment, polysilicon was used to form a conductive layer such as electrode. However, this invention is not limited to this arrangement. Namely, it is possible to apply any conductive material if it can be made into an insulating material by proper chemical treatment, for example, oxidation, and the resultant insulating material can act as a dielectric element. Such conductive material includes not only polysilicon but also, for example, molybdenum, tantalum, molybdenum silicide, tantalum silicide and any other polycide or silicide.

An oxidation-resistant layer used in the method of this invention is not limited to the silicon nitride applied in the foregoing embodiment. Any oxidation-resistant layer well serves the purpose, if it is prepared from a material having a higher oxidation resistance than a conductive layer forming material. Said oxidation-resistant material includes silicon carbide, molybdenum and tantalum.

The foregoing description refers to the case where a conductive layer was formed in which two polysilicon conductive layers overlapped each other. However, this invention is obviously applicable to the case where three or more polysilicon layers are involved. Where, for example, three polysilicon layers are formed, then the method of this invention can be applied to a second and third polysilicon conductive layers or a first and third polysilicon conductive layers.

Description was given of an MOS dynamic RAM for better understanding of this invention. However, this invention is not limited to this example. Fundamentally, the invention is applicable to all devices having a multilayer electrode and wiring. Where the invention is applied to, for example, an MOS static RAM, it is advised to form from a first polysilicon layer a load resistor electrode (corresponding to a second conductive layer) and a gate electrode (corresponding to a first conductive layer) of a driver MOS transistor, and use a second polysilicon layer to provide an electrode (corresponding to a third conductive layer) of a read-write transistor of a memory cell. In this case, a load resistor can be rendered extremely resistive, making it possible to provide a memory cell consuming a small amount of power.

This invention which has substantially eliminated disadvantages and drawbacks accompanying the prior art semiconductor device-manufacturing method has the following merits:

The effective channel length of an MOS transistor used in the peripheral circuit region of LSI was extremely shortened in the prior art due to the turned up condition of the edges of a first polysilicon layer (first conductive layer). This invention can eliminate this difficulty. In other words, the channel length of each MOS transistor can be extended by 0.7 micron. This means that based on the same polysilicon electrode width, this invention enables the effective channel length of the MOS transistor to be more extended as much as 0.7 micron than in the prior art, thereby reducing the undesirable short channel effect (the effect by which the threshold voltage of the MOS transistor falls due to a decline in its effective channel length and its conductivity is increased). Moreover, the short channel effect is extremely sensitive to the effective channel length. Therefore, any slight variation in the effective channel length immediately leads to a noticeable variation in the threshold voltage because of such high sensitivity. However, the method of this invention can extend the effective channel length of an MOS transistor, even if its polysilicon gate electrode has a small width, thereby restricting the extent of variations occurring in the threshold voltage of the MOS transistor. It is known that variations appear to widely different extents in the threshold voltages of MOS transistors even prepared from the same chip. With a circuit using a flip-flop circuit such as a sense up circuit of a dynamic RAM or a memory cell of a static RAM, the sensitivity of the sense up circuit and the read-write margin of a memory cell are defined by the extent to which the threshold voltages of the respective MOS transistors constituting the flip-flop circuit are made to coincide with a predetermined level. Therefore, the fact that the method of this invention can substantially fix the effective channel lengths of the MOS transistors of the peripheral circuit region including, for example, a flip-flop circuit bears an extremely great importance.

As previously described, this invention more extends the effective channel length of an MOS transistor than the prior art. Based on the same effective channel length, therefore, the invention makes it possible to use a polysilicon electrode narrower than in the prior art, thus contributing to the elevation of the degree of integration. With a 64K bit type dynamic RAM, the increased degree of integration enables a chip area to be decreased by about 10%.

Further, based on the same chip area, this invention enables a polysilicon electrode to be made narrower than the prior art, thereby allowing every adjacent polysilicon patterns to be more broadly spaced from each other than has been possible in the past. This advantageous effect facilitates photolithography applied in integrating semiconductor elements. Further, the width of a diffusion layer defined between the respective polysilicon conductive layers depends on an inter-pattern distance. Since the width of the diffusion layer can be broadened, it is possible to apply a wiring having a corresponding decreased resistance to the diffusion layer, thereby accelerating the operation of a semiconductor device.

The invention can more shorten the mutually superposed portions of the source or drain diffusion region and polysilicon gate electrode than has been possible in the past. The superposed portions jointly constitute a plate capacitor constructed by interposing a $SiO_2$ layer between the diffusion region and polysilicon gate electrode. This capacitor may be regarded as an element having a load capacitance as viewed from the operation of a semiconductor device. Therefore, the shorter the superposed portions, the smaller the load capacitance and consequently the more accelerated the operation of a semiconductor device. This invention for more reduces said load capacitance than the prior art.

A circuit making a dynamic ratioless operation consumes electric energy derived from a charged power having a load capacitance. The invention decreases the power consumption of such circuit.

This invention furthermore reduces the sheet resistance of a nonoxidized first polysilicon layer (first conductive layer) of the peripheral circuit region than has been possible in the past, thereby decreasing a delay in the transmission of a signal through the gate electrode of the MOS transistor itself and consequently accelerating the operation of a semiconductor device. The first polysilicon layer which formerly had a high sheet resistance could not be applied to a region where a relatively large current flowed, or to a wiring having a large load capacity at its end. As a result, a large number of aluminum wires had to be used, and the patterning design was rendered complicated and difficult. However, this invention eliminates the above-mentioned drawbacks accompanying the prior art and offers a large latitude to facilitate a patterning design.

According to this invention, first and second conductive layers having different thicknesses can be prepared from the same polysilicon layer. In other words, the same polysilicon layer can be divided into two portions having different sheet resistances. With the dynamic RAM, therefore, the capacitor electrode of a memory cell can be formed of a polysilicon layer having a high sheet resistance, and the electrode of the periphery circuit can be prepared from a polysilicon layer having a low sheet resistance. The capacitor electrode is commonly connected to a power source or grounded. The power source of the capacitor electrode is usually contaminated by various noises. These noises sometimes give rise to changes in the contents of a memory cell. Further, a high spike voltage is sometimes suddenly impressed on the memory cell from a power source. Where a thin SiO$_2$ layer of, for example, 300 Å is used to enlarge a capacitance as in the 64K bit type dynamic RAM, the gate SiO$_2$ layer of the capacitor is subject to static breakage, when the above-mentioned high static spike voltage is impressed. With this invention, however, the polysilicon electrode of the capacitor is formed of a first thin polysilicon layer having a high sheet resistance. Therefore, said polysilicon layer constitutes a low pass filter together with the load capacitance of a power source, thereby offering the effect of extinguishing noises and spike voltages. Consequently, the invention provides effective countermeasures for resolution of the above-mentioned problems.

Where a contact hole is formed in the insulation layer on the surface of a polysilicon electrode, this invention can reduce a difference between the height of a first polysilicon conductive layer of the peripheral circuit region and that of a third polysilicon conductive layer of a memory cell array region, thereby facilitating the lithography of a contact hole. In the case of LSI, as many as over 30% disqualified semiconductor devices result from unsatisfactory contact holes (for example, the insufficient opening or nonopening of a contact hole). Such contact hole defect results, for one thing, from a difference between the heights of, for example, polysilicon conductive layers. Such height difference results in an uneven distance between an IC mask and resist, causing the degree of resolution and time of light projection to change with the various regions of a substrate surface. Eventually, these drawbacks readily lead to the production of disqualified semiconductor devices. However, this invention which minimizes a difference between the heights of polysilicon conductive layers can minimize the adverse effects of the above-mentioned causes of the disqualification of a manufactured semiconductor device.

Where a contact hole is formed, this invention enables SiO$_2$ layers to be deposited on the surface of the first polysilicon conductive layer of the peripheral circuit region and also on the surface of the third polysilicon conductive layer of the memory cell array region with substantially the same thickness, thereby facilitating lithography and etching and improving the yield of a manufactured semiconductor device.

Hitherto, a SiO$_2$ layer was deposited on the surface of the first polysilicon conductive layer of the peripheral circuit region and also on the surface of the second polysilicon conductive layer of the memory cell array region by oxidation alike. Where, therefore, a contact hole was formed, difficulties were experienced, because a SiO$_2$ layer formed on the surface of the third polysilicon conductive layer of the memory cell array region and a SiO$_2$ layer deposited on the surface of the first polysilicon conductive layer of the peripheral circuit region had different thicknesses. In other words, an IC mask had to be provided solely for contact holes which were to be formed in the surface of the first and second polysilicon conductive layers, thereby making it necessary to apply lithography once more than otherwise required.

What is claimed is:

1. A semiconductor device which comprises:
   a semiconductor substrate in which at least three elements are formed;
   a first conductive substantially flat layer formed on the substrate to constitute a first element with a first insulation layer interposed between said first conductive layer and the substrate, said first conductive layer having a substantially uniform thickness and a side surface;
   a second conductive substantially flat layer formed on the substrate to constitute a second element with a second insulation layer interposed between said second conductive layer and the substrate, said second conductive layer being thinner than said first conductive layer and having a side surface spaced from the side surface of said first conductive layer; and
   a third conductive layer deposited over the second conductive layer to constitute a third element in a state superposed on said second conductive layer with a third insulation layer interposed between said second and third conductive layers, said third conductive layer having a side surface spaced from the side surface of said first conductive layer, the total thickness of said first insulation layer and said first conductive layer being substantially equal to the total thickness of said second insulation layer, said second conductive layer, said third insulation layer and said third conductive layer to position the top surfaces of said first and third conductive layers in the same horizontal plane, and with the side surface of said first conductive layer spaced from the side surfaces of said second and third conductive layers to provide a continuous vertically extending opening between said superposed second and third conductive layers and said first conductive layer.

2. The semiconductor device according to claim 1, wherein the first element is an MOS transistor; the second element is a capacitor; the third element is an MOS transistor; and the second and third elements jointly constitute a dynamic memory cell.

3. The semiconductor device according to claim 1 or 2, wherein the conductive material is polysilicon, molybdenum, tantalum, molybdenum silicide or tantalum silicide.

4. A semiconductor device which comprises:
   a semiconductor substrate in which at least three elements are formed;
   a first conductive substantially flat layer formed on the substrate to constitute a first element with a first insulation layer interposed between said first conductive layer and the substrate, said first conductive layer having a substantially uniform thickness and a side surface;
   a second conductive substantially flat layer formed on the substrate to constitute a second element with a second insulation layer interposed between said second conductive layer and the substrate, said second conductive layer being thinner than said first conductive layer and having a side surface spaced from the side surface of said first conductive layer; and
   a third conductive layer deposited over the second conductive layer to constitute a third element in a state superposed on said second conductive layer with a third insulation layer interposed between said second and third conductive layers and with a section of said third conductive layer projecting between said side surfaces of said first and second conductive layers and extending toward said side surface of said first conductive layer, said section terminating in a side surface spaced from the side surface of said first conductive layer, the total thickness of said first insulation layer and said first conductive layer being substantially equal to the total thickness of said second insulation layer, said second conductive layer, said third insulation layer and said third conductive layer to position the top surfaces of said first and third conductive layers in the same horizontal plane, and with the side surface of said first conductive layer spaced from the side surfaces of said second and third conductive layers to provide a continuous vertically extending opening between said superposed second and third conductive layers and said first conductive layer.

* * * * *